United States Patent [19]

Ziegler et al.

[11] 3,996,661
[45] Dec. 14, 1976

[54] METHOD FOR THE MANUFACTURE OF A SUPERCONDUCTOR HAVING AN INTERMETALLIC TWO ELEMENT COMPOUND

[75] Inventors: Günther Ziegler, Erlangen; Peter Lanig, Erlangen-Bruck, both of Germany

[73] Assignee: Siemens Aktiengesellschaft, Munich, Germany

[22] Filed: June 13, 1974

[21] Appl. No.: 478,963

[30] Foreign Application Priority Data
June 22, 1973 Germany .......................... 2331962

[52] U.S. Cl. ................................................ 29/599
[51] Int. Cl.² ....................................... H01V 11/00
[58] Field of Search ................................... 29/599

[56] References Cited
UNITED STATES PATENTS

| | | | |
|---|---|---|---|
| 3,277,564 | 10/1966 | Webber et al. | 29/419 |
| 3,370,347 | 2/1968 | Garwin et al. | 29/599 |
| 3,652,967 | 3/1972 | Tanaka et al. | 335/216 |
| 3,665,595 | 5/1972 | Tanaka et al. | 29/599 |
| 3,728,165 | 4/1973 | Howlett | 29/599 |
| 3,731,374 | 5/1973 | Suenaga et al. | 29/599 |
| 3,836,404 | 9/1974 | Strauss | 148/11.5 R |
| 3,876,473 | 4/1975 | McDougall | 29/599 |

FOREIGN PATENTS OR APPLICATIONS

| | | | |
|---|---|---|---|
| 1,377,399 | 9/1964 | France | 29/599 |
| 995,710 | 6/1965 | United Kingdom | 29/599 |

*Primary Examiner*—C.W. Lanham
*Assistant Examiner*—Vernon K. Rising
*Attorney, Agent, or Firm*—Kenyon & Kenyon Reilly Carr & Chapin

[57] ABSTRACT

A method of manufacturing a superconductor having a superconductive intermetallic compound made of two elements and having an A-15 crystal structure in which at least one core consisting of a ductile element of the compound is surrounded with a jacket of an alloy containing a ductile carrier metal and the second element of the compound after which the jacket is then covered with a tantalum layer and that layer then covered with a sheath of metal which is electrically and thermally highly conductive and is electrically normally conducting at the operating temperature of the superconductor. The structure thus obtained is then subjected to a cross section-reducing deformation after which it is heat-treated to form the intermetallic compound.

10 Claims, 3 Drawing Figures

METHOD FOR THE MANUFACTURE OF A SUPERCONDUCTOR HAVING AN INTERMETALLIC TWO ELEMENT COMPOUND

BACKGROUND OF THE INVENTION

This invention relates to the manufacture of superconductors in general and more particularly to an improved method of manufacturing a superconductor having a superconductive intermetallic compound made up of two elements.

Intermetallic superconducting compounds consisting of two elements of the type $A_3B$, for example, $Nb_3Sn$ or $V_3Ga$, and having an A-15 crystal structure are known to have very good superconductive properties and are distinguished in particular by a high critical magnetic field, a high transition temperature and a high critical current density. As a result, compounds of this nature are particularly well suited for superconducting coils used for generating strong magnetic fields such as those used, for example, for research purposes. In addition, such coils find application in the superconducting magnets used in the suspended guidance of magnetic suspension railroads or in the windings of electric machines. More recently, ternary compounds such as, niobium-aluminum-germanium ($Nb_3Al_{0.8}Ge_{0.2}$) have become of particular interest. However, since these compounds are very brittle, considerable difficulty is encountered in their manufacture into a form suitable for use in magnet coils or the like.

Several methods were developed, making possible the manufacture of superconductors with, in particular, two-component intermetallic compounds in the form of long wires or ribbons. These methods which are particularly applicable to the manufacture of multi-core conductors using wires of $Nb_3Sn$ and $V_3Ga$, embedded in a normal conducting matrix, are carried out by surrounding a ductile element of the compound to be produced in wire form, such as a niobium or vanadium wire in a sheath of an alloy containing a ductile carrier metal and other elements of the compound, e.g., a copper-tin alloy or a copper-gallium alloy. In particular, multiplicity of such wires can be embedded in a matrix of the alloy. Other ductile metals, e.g. silver, may also be used as carrier metals instead of copper as long as they do not react adversely with the elements of the compounds to be produced during a later heat treatment. The structure so obtained is then subjected to a cross section reducing process. This results on one hand, in a long wire such as that required by coils and on the other hand, the reduction of the diameter of the wire which is, for example, niobium or vanadium to a low size in the order of about 30 to 50 $\mu$m. This is desirable in view of the superconductive properties of the conductor. In addition, the cross section reducing process obtains the best possible metallurgical bond between the wire and the surrounding jacket material of the alloy, without the occurance of reactions that lead to an embrittlement of the conductor. During the course of cross section reducing, heat treatments may be necessary in order to heal lattice dislocations in sheath materials which occur during such formation and which result in a hardening of the sheath material. These heat treatments, however, are performed at temperatures so low that the desired intermetallic compound is not formed thereby. After the cross section-reducing process, the conductor, which consists of one or more wires and the surrounding matrix material, is subjected to heat treatment in such a manner that the desired compound is formed through the reaction of the wire material such as niobium or vanadium with the additional element of the compound contained in the surrounding matrix. This additional material would be, for example, tin or gallium. During this process, the element contained in the matrix diffuses into the wire material and reacts with the latter forming a layer consisting of the desired compound. Processes of this nature are disclosed in German Offenlegungsschrift 2,044,660, German Offenlegungsschrift 2,052,323, and German Offenlegungsschrift 2,105,828.

This process, however, suffers from a serious drawback. During diffusion, the entire element of the compound contained in the alloy sheath never diffuses into the wire or wires of the other element of the compound. Instead of being consumed in forming the compound, considerable quantities of this element remain in the matrix due to the diffusion conditions. This results in a relatively high electrical residual resistance in the portion of the matrix material containing some of the compound. For example, the residual resistance of copper increases quite steeply with an increasing gallium content. As a result, the sheath is not well suited as a stabilizing material for the superconductor. Electrical stabilization of te superconductor is, however, required as a rule, in order to prevent a sudden transition of the superconductor from the superconducting to the electrically normally conducting state. As is well known, the superconductor, in order to be stabilized, must be brought into intimate contact with a metal which is electrically and thermally highly conductive and is electricallly normally conducting at the operating temperature of the superconductor, e.g., at 4.2K. In addition, the stabilizing material must be able to rapidly remove the heat which is produced by the temporary local occurrence of normal conduction in the superconductor. This heat must be removed therefrom and transferred into the coolant such as liguid helium which surrounds the superconductor. In addition, the stabilizing material must be capable of taking over, at least for a short time, the current which normally flows through the superconductor, should a local occurrence of normal conduction come about. Copper, aluminum or silver, preferably in a highly purified form, are well suited as stabilizing materials.

Thus, it can be seen that all of the prior art processes for making intermetallic superconducting wires have drawbacks. The need for an improved process which avoids the above noted problems is therefor evident.

SUMMARY OF THE INVENTION

In view of this, it is an object of the present invention to provide a method of this nature retaining the advantages obtained through solid diffusion but at the same time obtaining good electrical stabilization of the superconductor.

The present invention solves this problem by surrounding a core consisting of a ductile element of the compound with a jacket of an alloy containing a ductile carrier material and a second element of the compound and then surrounding the jacket with a tantalum layer. The tantalum layer is then surrounded by a sheath of an electrically and thermally highly conductive meatl which is electrically normally conducting at the operating temperature of the superconductor. The structure so obtained is then subjected to a cross-section reducing deformation after which is is heat treated to form the intermetallic compound. During the heat treatment, diffusion takes place into the core which is made of the one element of the compound, diffusion taking place inward with the other element of the compound moving out of the jacket into the core. The two elements react to form a layer of superconductive alloy. Surprisingly, diffusion of the second element of the compound which is contained in the jacket into the sheath of electrically and thermally highly conductive metal surrounding the jacket is completely prevented by the tantalum so that the residual resistance of the sheath material is not increased by the elements of the compound diffusing into it. In addition, the tantalum does not diffuse into the sheath metal. The sheath which is in good mechanical contact on top of the tantalum layer with the jacket surrounding the core due to the cross-section reducing proces thereby forms excellent stabilization.

The method of the present invention is particularly well suited for the manufacture of a superconductor having the intermetallic compound $Nb_3Sn$. In making this compound, the core will preferably be niobium and the jacket a copper tin alloy with 3 to 8.5 atom-percent tin and the balance copper. Copper tin alloys of this composition are particularly advantageous because of their relatively high ductility. For the electrical and highly conductive sheath used for stabilization, copper is preferred. However, the other stabilizing materials noted above i.e., aluminum or silver, preferably in a highly purified form, may also be used. Heat treatment for forming the compound can advantageously be carried out at temperatures of between 650° and 850° C lasting from several minutes to approximately 60 hours.

Extensive experimental investigations have shown that with such a heat treatment, diffusion of tin contained in the jacket is completely prevented by the tantalum layer. Furthermore, under these conditions, tantalum does not diffuse into the copper sheath or into the copper tin jacket. In order to prevent diffusion of the tin into the copper sheath during extended heat treatments of long duration, the tantalum layer is preferably made thick enough that it is at least 10 $\mu$m in the finished conductor. In order to not make the effective overall current density in the conductor too small because of too high a tantalum content, tantalum layers in the finished conductor should if possible not be thicker than 50 $\mu$m however.

To obtain the highest possible effective overall current density in a multi-core conductor, it is preferable that each individual core and its associated jacket of the alloy not have an individual tantalum layer but that instead a common tantalum layer is provided for a plurality of such cores and their associated jackets. This structure can then be provided with a sheath of electrically and thermally, highly conducting metal. In such a process, it is possible for the individual cores in their jackets to be subjected to a cross-section reducing process before being enclosed by the tantalum layer. In the manufacture of a multi-core conductor containing very many superconducting cores, it is advantageous to combine cores with jackets into a sub-group and to surround them with an additional common jacket of the alloy and to then surround this jacket with tantalum layer afterwhich the latter is enclosed by a sheath of electrically and thermally highly conductive metal. Several sub-groups are then combined and surrounded again by such a sheath into an overall bundle which is then enclosed by a common sheath of electrically and thermally high conductive metal. The structure may then be processed using cross-section reducing deformation after which it is heat treated to form the desired intermetallic compound. When carrying out this method, the individual components can be subjected to cross-section reduction prior to being combined into sub-groups or the overall bundle respectively.

A further advantage of tantalum which relates to the cross-section reducing process is its good mechanical workability. This is very important since with the method of the present invention, a recovery anneal for tantalum would require temperatures of between 1400° and 2000° C, which temperatures are out of the question. However, care must be taken in the cross-section reducing process during which tantalum is present to insure that the tantalum does not come into direct contact with the drawing dies or rolls but that it is always covered with a sheath of electrically and thermally highly conductive metal during such working since tantalum has a tendency to cold weld if during the drawing process it should come into direct contact with the drawing dies.

For manufacturing multi-core conductors comprising several sub-bundles it is further advantageous to build up each sub-bundle using 5 to 15 cores provided with a jacket of the alloy. By using this number of cores it is insured that in the finished conductor, no core is far removed from the enclosing sheath of stabilizing metal.

DETAILED DESCRIPTION OF THE PREFERRED EMBODIMENT

Figure 1:
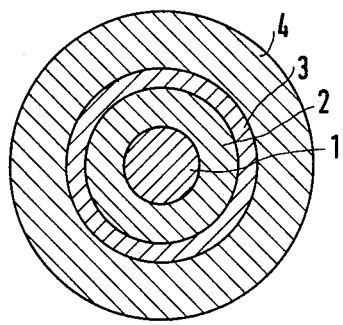
FIG. 1 is a schematic cross section illustrating a conductor structure according to the present invention.

FIG. 1 illustrates the basic construction of the conductor of the present invention illustrating a single core arrangment. Assuming an intermetallic compound of $Nb_3Sn$ is to be produced, a core 1 of niobium in wire form is provided which is surrounded by a tubular jacket 2 of a copper tin alloy containing about 8 atom-percent of tin. The jacket is then enclosed by a tantalum layer 3 which is in turn surrounded by a sheath 4 of copper. Fabrication of this structure can be accomplished by first placing a core 1 into a tube 2. After optional cross-section reduction pretreatment, this structure is then placed in a tantalum tube 3 which is in turn placed in a copper tube 4. The structure obtained in this manner is then processed by a plurality of suitable drawing or rolling passes into a long wire of reduced cross section. After the last cross-section reducing step, the wire is subjected to a heat treatment, preferably in a vacuum or protective gas causing a portion of the tin in the jacket 2 to diffuse into the niobium core 1 to react with the niobium therein and form an $Nb_3Sn$ layer 5 as shown on FIG. 2. Heat treatments will preferably be carried out at temperatures of between 650° and 850° C for a duration of approximately 30 hours.

Example 1

Figure 2:
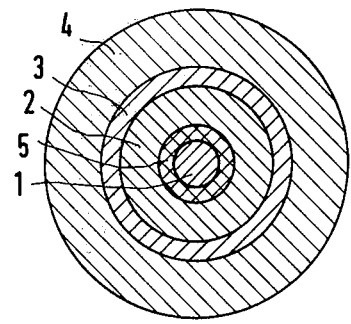
FIG. 2 illustrates the conductor structure of FIG. 1 after final heat treatment for forming the intermetallic compound.

In order to investigate the diffusion inhibiting effect of tantalum, a conductor according to FIG. 2 was fabricated from the structure shown in FIG. 1. Prior to cross-section reduction, the outside diameter of the structure, i.e., the outside diameter of the copper sheath was approximately 5 mm. The cross section of the structure was reduced by a number of drawing passes until the outside diameter was about 750 $\mu$m. Upon completion of cross-section reduction, the niobium core 1 had a diameter of about 250 $\mu$m, the jacket consisting of a copper tin alloy having approximately 8 atom-percent of tin a thickness of about 125 $\mu$m, the tantalum layer 3 of thickness of about 40 $\mu$m and the copper sheath a thickness of about 85 $\mu$m. The structure was heat treated at approximately 700° C for approximately 80 hours. The long duration was chosen in order to give the tin produced in the jacket 2 every opportunity to diffuse into the copper sheath 4. The Nb$_3$Sn layer 5 produced by the heat treatment had a thickness of about 5 $\mu$m. The residual resistance of the copper sheath 4 was determined before and after heat treatment. This was done by first measuring the residual resistance of the entire conductor and then dissolving the copper sheath from the sample in question and measuring the residual resistance of the remainder of the conductor. From the difference in conductance of the overall conductor including the copper sheath and the remainder of the conductor without the copper sheath, the residual resistivity of the copper sheath was calculated. Residual resistances of the copper sheath of $3 \times 10^{-7}$ ohm cm were measured before the heat treatment and $3 \times 10^{-8}$ ohm cm after heat treatment. The improvement of residual resistance is explained by the recovery of the cold-worked copper during the heat treatment at 700° C. Measurement of the residual resistance was performed at a temperature of 4K.

From the measured residual resistivities of the copper can be seen clearly that diffusion of tin from the jacket 2 into the copper sheath was completely prevented by the tantalum layer 3. A residual resistance of about $3 \times 10^{-8}$ ohm cm is the residual resistance of ordinary copper used for the stabilization of superconductors. This is the type used as a starting material for the tube 4. It is a well known fact that this residual resistance would increase substantially if tin were added to the copper. An alloy of the type copper noted above with 5 atom-percent of tin for example, would have a residual resistance of $10^{-5}$ ohm cm at a temperature of about 4K. To further prove the fact that diffusion of the tin into the copper had not taken place, microprobe investigations were performed. Carrying out such investigations no tin could be detected in the copper sheath. The detection limit for tin was about 0.025 atom-percent of tin in the instrumentation used. Furthermore, microprobe investigations showed that the tantalum had neither diffused into the copper sheath nor into the jacket of the copper tin alloy.

Molybdenum and iron were also investigated for suitability as diffusion inhibitors. These were found to have considerably less favorable properties than tantalum. Molybdenum is so much more difficult to deform than tantalum that, as a practical manner, it cannot really be considered for the manufacture of multi-core conductors. Because of this, its diffusion inhibiting properties were not further investigated. Despite its high deformability, iron does not prevent the diffusion of tin from a copper tin layer into a copper layer separated by the iron layer to such an extent that the tin does not increase the residual resistance of the copper.

As illustrated in FIG. 2, it is sufficient if the Nb$_3$Sn layer is only formed on the outside of core 1. The core does not need to be reacted completely through to Nb$_3$Sn. The extent to which the core reacts all the way through depends on the duration of the heat treatment as well as the temperature used during such treatment. In addition, the diameter of the core 1 and the amount of tin present in the jacket 2, i.e., the thickness of the jacket and the tin content of the copper tin alloy are important. The thinner the core 1 the higher the tin content within the jacket 1, the greater the probability that the entire core 1 will be reacted. The thickness of the completely reacted layer 5 will also increase with increased temperature and increased duration of heat treatment. Exact reaction parameters can readily be determined for each individual case.

Example 2

Figure 3:
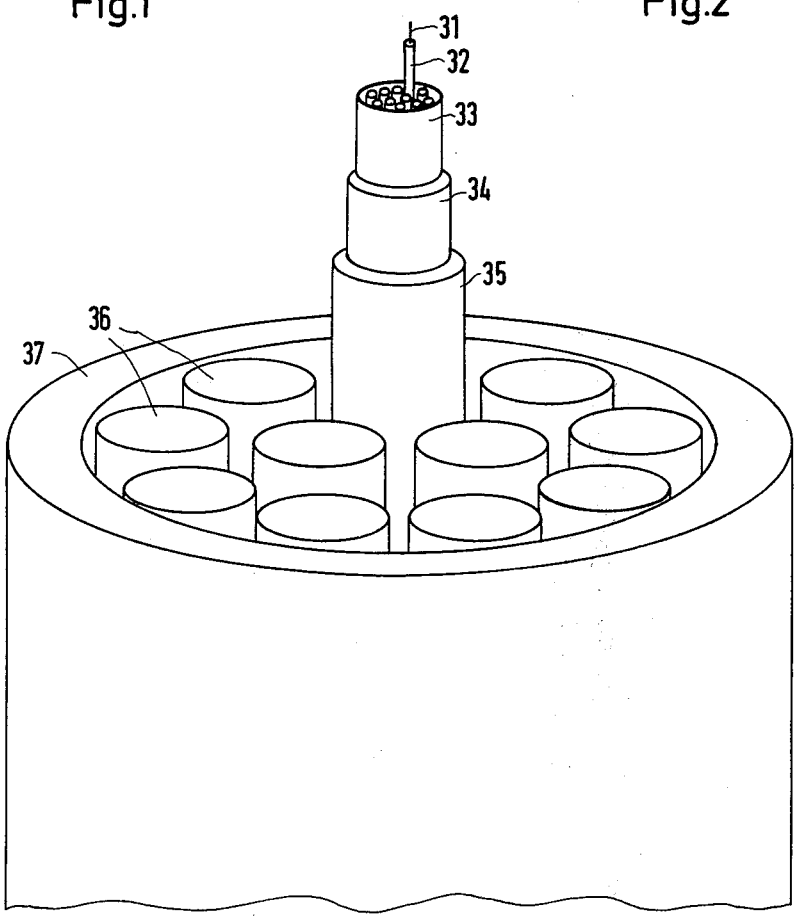
FIG. 3 is a schematic perspective illustration of a multi-core conductor manufactured in accordance with the present invention.

FIG. 3 is a perspective view helpful in understanding the method of the present invention as applied to the manufacture of multi-core conductors. In accordance with this method, a single core conductor consisting of a niobium wire 31 with a copper tin jacket 32 containing about 8-atom percent of tin is first manufactured. To accomplish this, a niobium rod is placed in the tube of the alloy in the structure so obtained reduced by cross-section reducing deformations such that the niobium wire 31 has a diameter of about 0.5 mm and the copper tin jacket 32 an outside diameter of about 0.8 mm. Cross-section reducing takes place with an intermediate anneal at a temperature of about 550° C for about 30 minutes after each cross-section reduction of 30%. This heals the lattice dislocation that have occured in the copper tin jacket. Ten of such single-core conductors are then placed in a copper tin tube 33 having an inside diameter of about 2.8 mm and an outside diameter of about 3.4 mm. A tantalum tube 34 with an inside diameter of about 3.4 mm and an outside diameter of about 4 mm is then pushed onto the copper tin tube 33. Over tantalum tube 34, a copper tube 35 with an inside diameter of about 4 mm and an outside diameter of about 5 mm is then pushed. The inside diameter of each tube must, of course, be somewhat larger than the outside diameter of the preceding tube so that the tubes can be telescoped together.

Ten units of a structure obtained in this manner, each about 20 cm long and designated generally as 36 on FIG. 3 are then placed in a copper tube 37 with an inside diameter of about 20 mm and a wall thickness of about 3 mm. This structure is then drawn down in a series of cross-section reducing deformation passes to an overall outside diameter of about 0.4 mm. After the last deformation pass, the conductor will be more than 500 m long. Again, during deformation, an intermediate anneal at a temperature of about 550° C for 30 minutes is carried out after each cross-section reduction of about 30%. After the last deformation pass, the conductor is annealed in a vacuum at a temperature of about 700° C for about 20 hours. During the process, an Nb$_3$Sn layer several micrometers thick is formed on the surface of each of the niobium cores 31. With a multi-core conductor made in this manner, effective critical current densities of between $10^{+4}$ and $10^{+5}$ A/cm$^2$ referred to the total conductor cross section including the stabilizing material and the tantalum layers are obtained. This is at a temperature of about 4.2K and an external magnetic field of about 5 Teslas. The stabilizing effect of the completely tin-free copper sheath is very good and is not influenced by the electrical resistance of the tantalum layers since this resistance can be essentially ignored due to the thinness of the layers.

Variations of the above described process for making a multi-core conductor are possible. For example, the partial conductors 36 may be placed in a copper block provided with suitable holes and the resulting structure then subjected to a cross-section reducing process. Alternatively, further stabilizing copper wires can be inserted into the copper tube 37.

The method of the present invention may also be used for the manufacture of conductors having other intermetallic compounds such as $V_3Ga$. Tantalum can also inhibit the diffusion of gallium. When making such a superconductor component, vanadium is preferably used as a core material and a copper gallium alloy with 0.1 to 30 atom-percent and preferably 0.1 to 18 atom-percent of gallium with the balance copper, used as the alloy material for the jacket. Copper is again preferably used as the material for the electrical and thermally highly conductive sheath. Heat treatment for producing $V_3Ga$ layers can be performed preferably at temperatures between 500° and 950° C lasting from about 5 minutes to 100 hours depending on the gallium content of the copper-gallium alloy and the $V_3Ga$ layer thickness desired.

In addition to the above noted advantages, the superconductor produced by the method according to the present invention, also has the advantage that the cross section of the sheath metal used for stabilization as compared to the superconductor cross section itself can be varied within relatively wide limits in accordance with the requirements of a particular application. In addition, the method of the present invention has the advantage that the entire superconductor including stabilization can be constructed to a series of deformation passes prior to the heat treatment and need not be subjected to further process steps after heat treatment. In previously developed superconductors such as those in which $Nb_3Sn$ cores are embedded in a matrix of a copper-tin alloy, in principle, the matrix on the outside can again be surrounded with stabilizing material. However, if this is done prior to the heat treatment, tin will diffuse during the heat treatment, not only into niobium cores, but also into the stabilizing material surrounding the copper-tin alloy, thereby increasing its residual resistance and decreasing its stabilizing effect considerably. If the stabilizing material is not applied until after the heat treatment, the only practical manner of doing this is electrolytically, since sensitive layers of the superconductor component cannot be subjected to further deformation passes. Thus, the method of the present invention is a considerable simplification over these prior art expensive methods.

Thus an improved method of making superconductors having a superconductive intermetallic compound of two elements in which a tantalum layer is used to prevent diffusion of the elements into a stabilizing metal has been shown. Although specific methods have been disclosed, it will be obvious to those skilled in the art that various modifications may be made without departing from the spirit of the invention which is intended to be limited solely by the appended claims.

We claim:
1. A method for the manufacture of a multicore superconductor having a superconductive intermetallic compound made up of two elements and having an A-15 crystal structure comprising the steps of:
    a. forming a plurality of cores consisting of a first ductile element of the compound;
    b. surrounding each of said cores with a jacket consisting of an alloy containing a ductile carrier metal and a second element of the compound;
    c. enclosing said plurality of cores and said jackets in a tantalum tube;
    d. surrounding said tantalum tube with an inner sheath of an electrically and thermally highly conductive metal which is electrically normally conducting at the operating temperature of the superconductor thereby forming a subgroup, said metal selected from the group consisting of copper, aluminum and silver;
    e. enclosing a plurality of said subgroups with a common outer sheath of electrically and thermally highly conductive metal which is electrically normally conducting at the operating temperature of the superconductor, said metal selected group consisting of copper, aluminum and silver;
    f. subjecting the structure so obtained to a crosssection reducing deformation; and
    g. heat treating the structure of reduced cross-section to form said intermetallic compound.
2. A method according to claim 1 wherein said inner and outer sheaths consist of copper.
3. A method according to claim 1 wherein the thickness of said tantalum layer is at least 10 $\mu m$ in the finished conductor.
4. A method according to claim 3 wherein said thickness of the tantalum layer is between 10 and 50 $\mu m$ in the finished conductor.
5. A method according to claim 1 wherein said intermetallic compound is $Nb_3Sn$.
6. A method according to claim 5 wherein said core consists of niobium and said jacket consists of a copper-tin alloy with 3 to 8.5 atom-percent of tin and the balance copper.
7. A method according to claim 6 wherein said inner and outer sheaths consist of copper.
8. A method according to claim 7 wherein the thickness of said tantalum layer is at least 10 $\mu m$ in the finished conductor.
9. A method according to claim 8 wherein said thickness of the tantalum layer is between 10 and 50 $\mu m$ in the finished conductor.
10. A method according to claim 1 wherein each of said sub-groups is made up of between 5 and 15 cores covered with alloy jackets.

* * * * *